United States Patent
Hu et al.

(10) Patent No.: US 11,372,300 B2
(45) Date of Patent: Jun. 28, 2022

(54) METHOD OF PREPARING GRAPHENE CIRCUIT PATTERN

(71) Applicants: BOE TECHNOLOGY GROUP CO., LTD., Beijing (CN); FUZHOU BOE OPTOELECTRONICS TECHNOLOGY CO., LTD., Fujian (CN)

(72) Inventors: Bo Hu, Beijing (CN); Wenchao Wang, Beijing (CN); Baoqiang Wang, Beijing (CN); Sang Jin Park, Beijing (CN)

(73) Assignees: BOE TECHNOLOGY GROUP CO., LTD., Beijing (CN); FUZHOU BOE OPTOELECTRONICS TECHNOLOGY CO., LTD., Fujian (CN)

(*) Notice: Subject to any disclaimer, the term of this patent is extended or adjusted under 35 U.S.C. 154(b) by 767 days.

(21) Appl. No.: 16/094,130

(22) PCT Filed: Mar. 15, 2018

(86) PCT No.: PCT/CN2018/079179
§ 371 (c)(1),
(2) Date: Oct. 16, 2018

(87) PCT Pub. No.: WO2019/033752
PCT Pub. Date: Feb. 21, 2019

(65) Prior Publication Data
US 2021/0223653 A1    Jul. 22, 2021

(30) Foreign Application Priority Data
Aug. 18, 2017    (CN) .................. 201710713723.X (51) Int. Cl.
*G02F 1/1362* (2006.01)
*H05K 1/09* (2006.01)
(Continued)

(52) U.S. Cl.
CPC ......... *G02F 1/136295* (2021.01); *H05K 1/09* (2013.01); *H05K 3/10* (2013.01);
(Continued)

(58) Field of Classification Search
USPC .................................................. 427/58, 122
See application file for complete search history.

(56) References Cited

U.S. PATENT DOCUMENTS

| 10,002,720 B2 * | 6/2018 | Zhao ...................... C01B 32/23 |
| 2012/0170171 A1 * | 7/2012 | Lee ........................ H01G 11/42 |
| | | 361/502 |

(Continued)

FOREIGN PATENT DOCUMENTS

| CN | 106986333 A | 10/2012 |
| CN | 104835729 A | 8/2015 |

(Continued)

OTHER PUBLICATIONS

Extended European Search Report Application No. 18782291.1; dated Mar. 22, 2021.
(Continued)

*Primary Examiner* — Brian K Talbot (57) ABSTRACT

A method of preparing a graphene circuit pattern, a substrate and an electronic product are disclosed. The method of preparing a graphene circuit pattern includes: immersing a metal circuit pattern in a graphene oxide solution to cause a redox reaction between the metal circuit pattern and graphene oxide, thereby forming the graphene circuit pattern. The graphene circuit pattern may be directly formed at a location of the metal circuit pattern, and is simple in production process, low in cost, and suitable for mass production.

17 Claims, 4 Drawing Sheets

S101 — Immerse a metal circuit pattern in a graphene oxide solution

S102 — Form a graphene circuit pattern (51) Int. Cl.
*H05K 3/10* (2006.01)
*H05K 3/12* (2006.01)
*H05K 3/46* (2006.01)
*B05D 7/00* (2006.01)
*B05D 5/12* (2006.01)
*B05D 3/02* (2006.01)
*H05K 3/18* (2006.01)

(52) U.S. Cl.
CPC ............... *B05D 3/02* (2013.01); *B05D 5/12* (2013.01); *B05D 7/54* (2013.01); *H05K 3/12* (2013.01); *H05K 3/1208* (2013.01); *H05K 3/18* (2013.01); *H05K 3/46* (2013.01); *H05K 3/4608* (2013.01); *H05K 3/4644* (2013.01); *H05K 3/4661* (2013.01); *H05K 2201/0323* (2013.01)

(56) References Cited

U.S. PATENT DOCUMENTS

| | | | | |
|---|---|---|---|---|
| 2014/0199829 | A1* | 7/2014 | Matsumoto | H01L 21/76823 438/610 |
| 2014/0212659 | A1* | 7/2014 | Dai | B32B 27/281 428/336 |
| 2015/0014022 | A1* | 1/2015 | Young | H05K 1/0313 174/251 |
| 2015/0155077 | A1* | 6/2015 | Yamazaki | H01B 1/04 174/257 |
| 2015/0257258 | A1* | 9/2015 | Naito | H05K 1/0274 257/99 |
| 2016/0012936 | A1* | 1/2016 | Wu | H01B 1/24 428/195.1 |
| 2019/0200459 | A1* | 6/2019 | Yen | C23C 18/1893 |

FOREIGN PATENT DOCUMENTS

| | | | | |
|---|---|---|---|---|
| CN | 104944414 | A | | 9/2015 |
| CN | 105752967 | A | | 7/2016 |
| CN | 106653696 | A | | 5/2017 |
| CN | 106986333 | A | | 7/2017 |
| JP | 2017-020944 | A | | 1/2017 |
| KR | 1020150069943 | A | * 6/2015 | ............ G06F 3/004 |
| KR | 1020150069943 | A | | 6/2015 |

OTHER PUBLICATIONS

1 The First Chinese Office Action dated Oct. 18, 2019; Appln. No. 201710713723.X.

International Search Report and Written Opinion dated Jun. 20, 2018; PCT/CN2018/079179.

* cited by examiner

METHOD OF PREPARING GRAPHENE CIRCUIT PATTERN

The present application claims priority to Chinese patent application No. 201710713723.X, filed on Aug. 18, 2017, the entire disclosure of which is incorporated herein by reference as part of the present application.

TECHNICAL FIELD

Embodiments of the present disclosure relate to a method of preparing a graphene circuit pattern, a substrate and an electronic product.

BACKGROUND

At present, signal lines of electronic products generally employ circuit patterns of metals such as Cu or Al, but the resistance of the metal circuit patterns is large and the corrosion resistance thereof is weak, thus the development and application of the metal circuit patterns in high-end products are limited. Graphene has excellent electrical conductivity and stability, and its resistivity is only about $10^{-8}$ Ω·m, while the resistivity of pure copper is 0.017 Ω·m, 170,000 times higher than that of graphene.

SUMMARY

At least an embodiment of the present disclosure provides a method of preparing a graphene circuit pattern, and the method comprises: immersing a metal circuit pattern in a graphene oxide solution to cause a redox reaction between the metal circuit pattern and graphene oxide, thereby forming the graphene circuit pattern at a location where the metal circuit pattern are located.

For example, in the method of preparing a graphene circuit pattern provided by at least an embodiment of the present disclosure, the metal circuit pattern comprises a circuit pattern formed of a copper containing metallic material, an aluminum containing metallic material or an iron containing metallic material.

For example, in the method of preparing a graphene circuit pattern provided by at least an embodiment of the present disclosure, the graphene oxide solution is a dispersion of the graphene oxide in water.

For example, in the method of preparing a graphene circuit pattern provided by at least an embodiment of the present disclosure, a concentration of the graphene oxide solution is (0.01-10) g/L.

For example, in the method of preparing a graphene circuit pattern provided by at least an embodiment of the present disclosure, the concentration of the graphene oxide solution is (0.1-1) g/L.

For example, in the method of preparing a graphene circuit pattern provided by at least an embodiment of the present disclosure, a thickness of the metal circuit pattern is 20 nm-1000 nm.

For example, in the method of preparing a graphene circuit pattern provided by at least an embodiment of the present disclosure, the thickness of the metal circuit pattern is 40 nm-700 nm.

For example, the method of preparing a graphene circuit pattern provided by at least an embodiment of the present disclosure further comprises: drying the graphene circuit pattern.

For example, in the method of preparing a graphene circuit pattern provided by at least an embodiment of the present disclosure, the drying is performed at a temperature of 1° C.-10° C.

For example, in the method of preparing a graphene circuit pattern provided by at least an embodiment of the present disclosure, the drying is performed at a temperature of 4° C.-7° C.

For example, the method of preparing a graphene circuit pattern provided by at least an embodiment of the present disclosure further comprises: preparing the metal circuit pattern on a substrate, and then immersing the substrate with the metal circuit pattern in the graphene oxide solution.

For example, in the method of preparing a graphene circuit pattern provided by at least an embodiment of the present disclosure, a concentration of the graphene oxide solution and/or a time period of the redox reaction is adjusted to control a thickness of the graphene circuit pattern.

At least an embodiment of the present disclosure provides a substrate, which comprises the graphene circuit pattern prepared by any one of the aforementioned methods.

At least an embodiment of the present disclosure provides an electronic product, which comprises any aforementioned substrate.

For example, in the electronic product provided by at least an embodiment of the present disclosure, the electronic product is a liquid crystal display panel or an organic light-emitting display panel.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not limited to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Graphene has excellent electrical conductivity and stability, and its resistivity is only about $10^{-8}$ Ω·m. However, in present production, there is still no such a method that can prepare a graphene circuit pattern (such as wiring, electrodes, etc.) with a low-cost and simple procedure.

At least an embodiment of the present disclosure provides a method of preparing a graphene circuit pattern, and the method comprises: immersing a metal circuit pattern in a graphene oxide solution to cause a redox reaction between the metal circuit pattern and graphene oxide, thereby forming the graphene circuit pattern at a location where the metal circuit pattern are located.

At least an embodiment of the present disclosure provides a substrate, which comprises the graphene circuit pattern prepared by any one of the aforementioned methods.

At least an embodiment of the present disclosure provides an electronic product, which comprises the aforementioned substrate.

The method of preparing a graphene circuit pattern, the substrate and the electronic product of the present disclosure are described with some specific embodiments hereinafter.

At least an embodiment of the present disclosure provides a method of preparing a graphene circuit pattern, so that the graphene circuit pattern can be used to form a circuit, for example connecting to different devices, reducing an impedance of the circuit and improving performance of the circuit. The graphene circuit pattern can be in various forms, such as wire, electrode, etc., and is not limited in the embodiments of the present disclosure.

Figure 1:
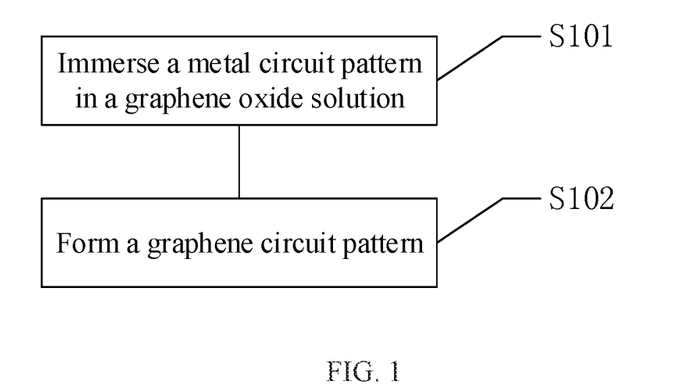
FIG. 1 is a flowchart of a method of preparing a graphene circuit pattern provided by an embodiment of the present disclosure.

As shown in FIG. 1, the method of preparing a graphene circuit pattern provided by an embodiment comprises step S101 to step S102.

Step S101: immersing a metal circuit pattern in a graphene oxide solution.

Figure 2A:
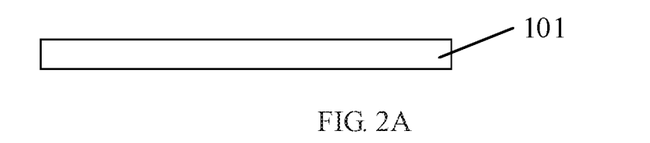
FIG. 2A to FIG. 2D are schematic diagrams of a method of preparing a graphene circuit pattern provided by an embodiment of the present disclosure.

In this embodiment, as shown in FIG. 2A, a metal circuit pattern 101 may be a metal circuit that can undergo a redox reaction with graphene oxide, such as a metal circuit pattern formed of a copper containing metallic material, an aluminum containing metallic material or an iron containing metallic material; the graphene oxide may be, for example, commercially available or self-made. The metal circuit pattern 101 may be, for example, a separate pattern, or a pattern provided on a substrate. For example, the metal circuit pattern 101 may be formed on the substrate by means of printing or the like, and the substrate may be made of a material, such as plastic, glass, ceramic, etc.

Figure 2B:
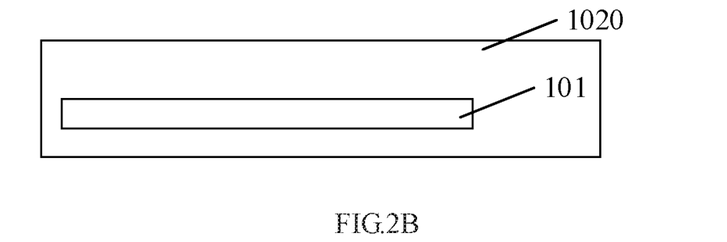

In this embodiment, as shown in FIG. 2B, the graphene oxide solution 1020 may be, for example, a dispersion of the graphene oxide in water. That is to say, the simple dispersion of the graphene oxide in water can undergo the redox reaction with the metal circuit pattern 101 spontaneously so that a graphene circuit pattern can be obtained. The concentration of the graphene oxide solution may be, for example, about (0.01-10) g/L, and for example (0.1-1) g/L, and at this concentration the process of the redox reaction is controllable, and the graphene circuit patterns of an expected thickness can be easily obtained. In addition, the concentration of the graphene oxide solution may be selected, for example, depending on the specific material and thickness of the metal circuit pattern 101 and an expected reaction time period, etc. For example, the stronger reducibility the material of the metal circuit pattern 101 possesses, the more easily the redox reaction with the graphene oxide solution occurs, so the graphene oxide solution of a lower concentration can be selected; for example, the higher the concentration of the graphene oxide solution is, the thicker the graphene pattern produced from the redox reaction per unit time is, so the time period that the redox reaction proceeds can be shorter. For example, the graphene oxide is dispersed in deionized water or aqueous solution at a concentration of about (0.05) g/L, (0.1) g/L, (0.3) g/L, 3 g/L, 5 g/L, 8 g/L or 10 g/L, etc., so as to form a dispersion of the graphene oxide. Of course, the aqueous solution can also be, for example, acidic or alkaline.

Step S102: forming a graphene circuit pattern.

Figure 2C:
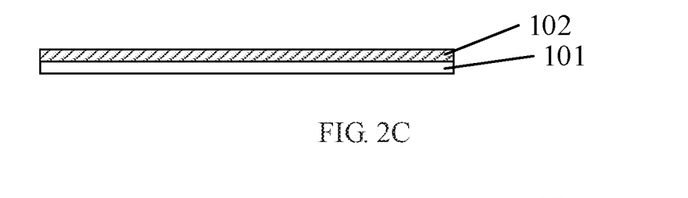

In this embodiment, as shown in FIG. 2B and FIG. 2C, after being immersed in the graphene oxide solution 1020, the metal circuit pattern 101 undergoes the redox reaction with the graphene oxide, so that the graphene circuit pattern 102 is formed at the location of the metal circuit pattern 101, and the metal circuit pattern 101 is oxidized to corresponding metal ion or metal oxide which enter the graphene oxide solution 1020.

In this embodiment, in the case of sufficient reactants, for example, the concentration of the graphene oxide solution 1020 and/or the time period of the redox reaction may be adjusted to control the size of the graphene circuit pattern 102, for example, the thickness of the graphene circuit pattern 102. For example, the higher the concentration of the graphene oxide solution 1020 is, the greater the rate of the redox reaction between the metal circuit pattern 101 and the graphene oxide is, so the thickness of the graphene circuit pattern 102 formed in a same time period can become greater; for example, in the case of a certain concentration of the graphene oxide solution 1020, the longer the time period of the redox reaction is, the thicker the thereby formed graphene circuit pattern 102 is.

Figure 2D:
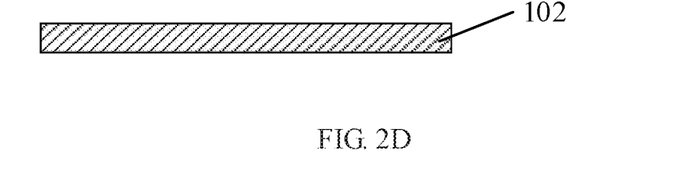

In this embodiment, the thickness of the metal circuit pattern 101 can be selected according to requirements, for example, the thickness of the metal circuit pattern 101 can be selected within a range of 20 nm-1000 nm, for example, 40 nm-700 nm, for example, 100 nm-300 nm or other suitable size. Therefore, after the metal circuit pattern 101 completely reacts with the graphene oxide, the metal circuit pattern 101 is completely consumed, and the graphene circuit pattern 102 is formed at the location of the metal circuit pattern 101, as shown in FIG. 2D. The thickness of the graphene circuit pattern 102 formed in this example may be adjusted by selection of the thickness of the metal circuit pattern 101; the greater the thickness of the metal circuit pattern 101 is, the greater the thickness of the graphene circuit pattern 102, which is formed after the metal circuit pattern 101 completely reacts with the graphene oxide, is.

Figure 3:
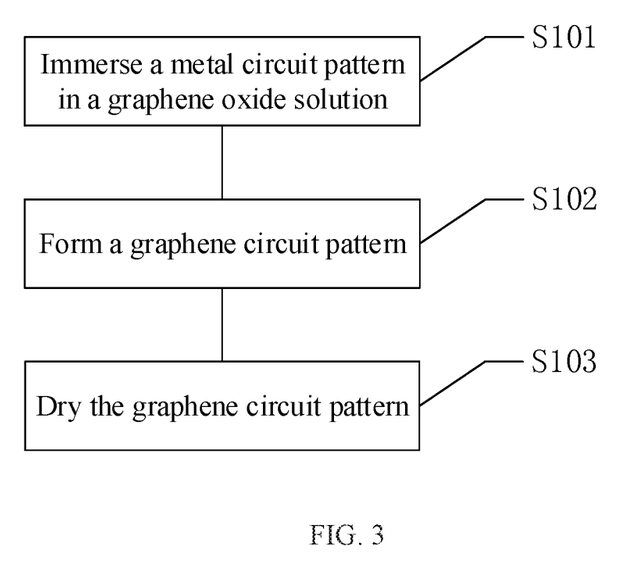
FIG. 3 is a flowchart of a method of preparing a graphene circuit pattern provided by another embodiment of the present disclosure.

In an example of the present embodiment, as shown in FIG. 3, the method of preparing a graphene circuit pattern, for example, further comprises step S103.

Step S103: drying the graphene circuit pattern.

In this embodiment, after being formed, the graphene circuit pattern 102 may be dried; a drying process may be performed, for example, in a temperature range of 1° C.-10° C., for example, 4° C.-7° C., or 5° C.-6° C. Drying the graphene circuit pattern 102 at a low temperature can reduce the drying rate of the graphene circuit pattern 102, prevent internal stress from being induced in the graphene circuit pattern 102 during the rapid drying, and moreover, avoid crack of the graphene circuit pattern 102.

The method of preparing a graphene circuit pattern provided by the embodiments is simple in preparation process, low in cost, and suitable for mass production; in addition, the graphene circuit pattern, which is prepared by the method of preparing a graphene circuit pattern provided by the embodiments, is adjustable in size. The graphene circuit pattern has excellent electrical conductivity and stability, and can be applied as signal lines or the like in various applications, such as an electronic product.

Figure 4:
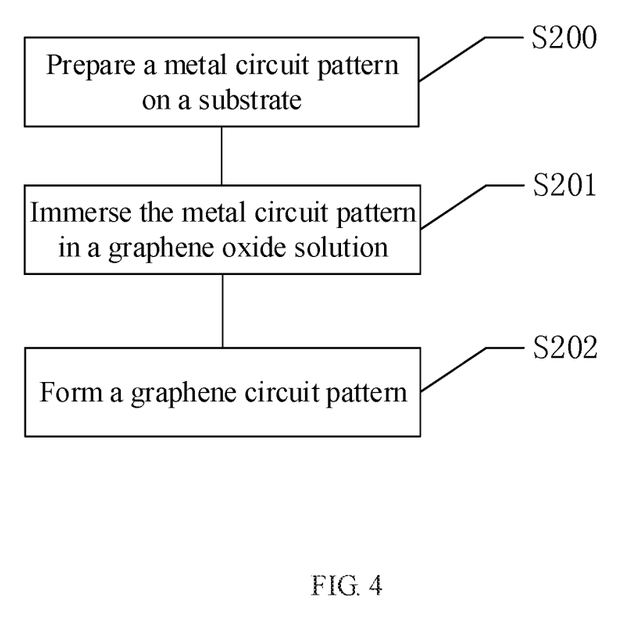
FIG. 4 is a flowchart of a method of preparing a graphene circuit pattern provided by still another embodiment of the present disclosure.

At least an embodiment of the present disclosure provides a method of preparing a graphene circuit pattern, as shown in FIG. 4, and the method of preparing a graphene circuit pattern comprises step S200-step S202.

Step S200: preparing a metal circuit pattern on a substrate.

Figure 5A:
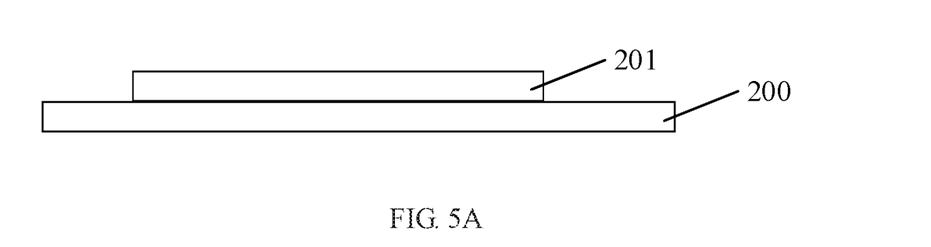
FIG. 5A to FIG. 5D are schematic diagrams of a method of preparing a graphene circuit pattern provided by still another embodiment of the present disclosure.

For example, step S200 may be performed by a method of fabricating a printed circuit board, or a method of fabricating a semiconductor substrate. In this embodiment, as shown in FIG. 5, a metal circuit pattern 201, for example, may be self-made. For example, a selected metallic material, such as a copper containing metallic material (copper or copper alloy), an iron containing metallic material (iron or iron alloy) or an aluminum containing metallic material (aluminum or aluminum alloy), etc., may be deposited on the substrate by means of magnetron sputtering, etc., to form a metal film, and then a metal circuit pattern 201 can be formed at appropriate location of the substrate 200 by an etching method, so that the printed circuit is obtained; alternatively, for example, a selected metallic material, such as copper, iron or aluminum, etc., is formed as a thin film on the surface of the substrate 200, and then the patterned metal circuit pattern 201 is formed by means of a photolithographic process, etc., so the semiconductor substrate is obtained. The metal circuit pattern formed on the substrate may have a more complicated profile, and the outline of the pattern may be, for example, continuous, or discontinuous.

Step S201: immersing the metal circuit pattern in a graphene oxide solution.

Figure 5B:
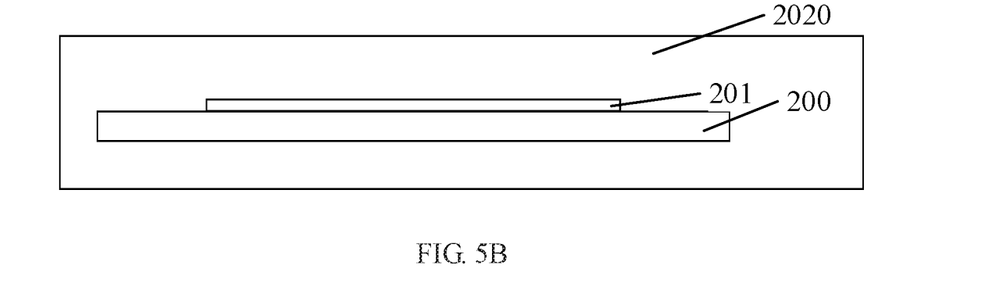

In this embodiment, after the metal circuit pattern 201 is prepared on the substrate 200, as shown in FIG. 5B, the substrate 200 with the metal circuit pattern 201 is immersed in a graphene oxide solution 2020. In this embodiment, a graphene oxide solution 2020 may be, for example, a dispersion of the graphene oxide in water, and the concentration of the graphene oxide solution may be, for example, about (0.01-10) g/L, for example, (0.1-1) g/L, and for example, (0.1-0.5) g/L. For example, the graphene oxide is dispersed in an aqueous solution at a concentration of about (0.05) g/L, (0.1) g/L, (0.2) g/L, (0.3) g/L, (0.5) g/L, 3 g/L, 5 g/L, 8 g/L or 10 g/L, so as to form a dispersion of the graphene oxide in water.

Step S202: forming a graphene circuit pattern.

Figure 5C:
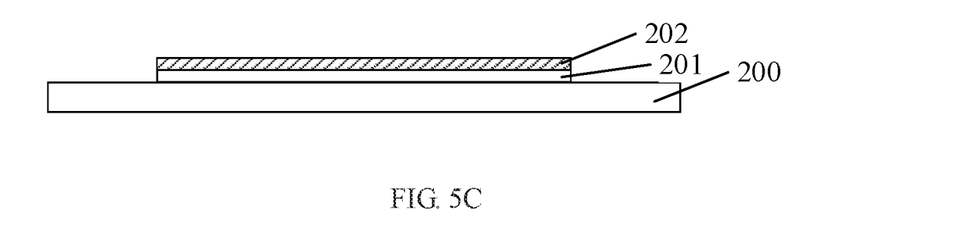

In this embodiment, as shown in FIG. 5B and FIG. 5C, after the substrate 200 with the metal circuit pattern 201 is immersed in the dispersion of the graphene oxide, the metal circuit pattern 201 undergoes a redox reaction with the graphene oxide, so a graphene circuit pattern 202 is formed at the location of the metal circuit pattern 201 on the substrate 200, and the metal circuit pattern 101 is oxidized to corresponding metal ion or metal oxide, entering the dispersion of the graphene oxide.

In this embodiment, for example, the concentration of the graphene oxide solution 1020 and/or the time period of the redox reaction may be adjusted to control the size of the graphene circuit pattern 102, for example, the thickness of the graphene circuit pattern 102. The specific adjustment method is the same as the previous embodiment, and is not repeatedly described herein.

In this embodiment, the thickness of the metal circuit pattern 201 can be selected according to requirements, for example, the thickness of the metal circuit pattern 201 can be selected within a range of 20 nm-1000 nm, for example, 40 nm-700 nm, for example, 100 nm-300 nm or other suitable size. Therefore, when the metal circuit pattern 201 is completely reacted with the graphene oxide, the metal circuit pattern 201 is completely consumed, and the graphene circuit pattern 202 is formed at the location of the metal circuit pattern 201 on the substrate 200. Therefore, the thickness of the graphene circuit pattern 202 formed in this example can be adjusted by selection of the thickness of the metal circuit pattern 201; the greater the thickness of the metal circuit pattern 201 is, the greater the thickness of the graphene circuit pattern 202, which is formed after the metal circuit pattern 201 is completely reacted with the graphene oxide, is.

Figure 6:
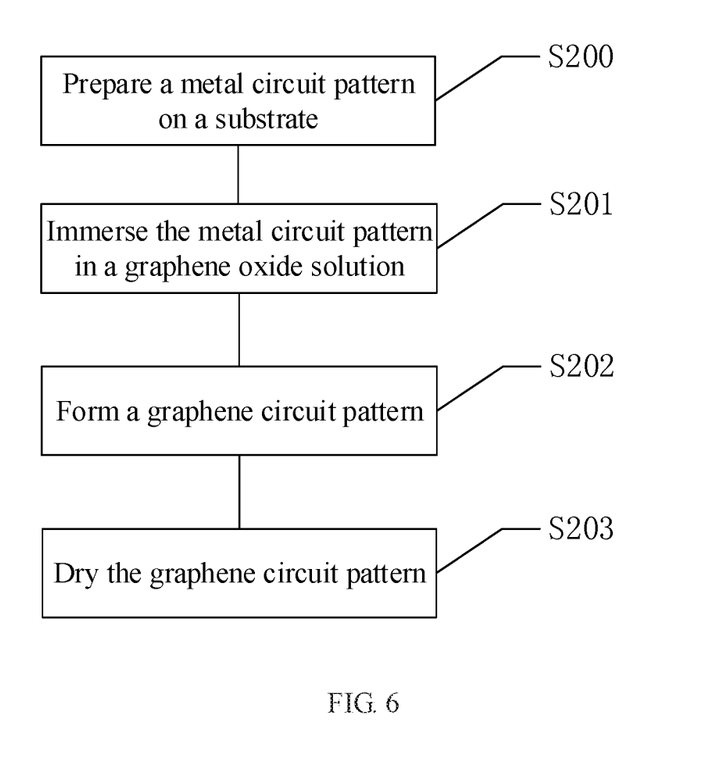
FIG. 6 is a flowchart of a method of preparing a graphene circuit pattern provided by still another embodiment of the present disclosure.

In an example of the present embodiment, as shown in FIG. 6, the method of preparing a graphene circuit pattern, for example, further comprises step S203.

Step S203: drying the graphene circuit pattern.

In this embodiment, after being formed, the graphene circuit pattern 202 may be dried; a drying process may be performed, for example, at a temperature range of 1° C.-10° C., for example, 4° C.-7° C., or 5° C.-6° C. Drying the graphene circuit pattern 202 at a low temperature can reduce the drying rate of the graphene circuit pattern 202, prevent internal stress from being induced in the graphene circuit pattern 202 during the rapid drying, and moreover, avoid crack of the graphene circuit pattern 202.

Figure 5D:
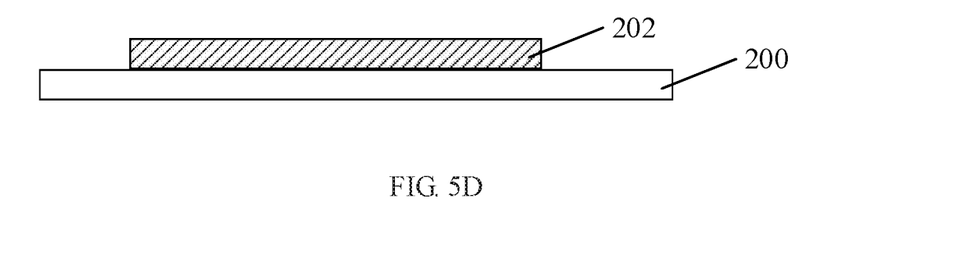

In this embodiment, the substrate 200, for example, may be a suitable substrate, such as a glass substrate or a quartz substrate, etc., therefore, after the substrate 200 with the metal circuit pattern 201 is immersed in the dispersion of the graphene oxide, the graphene circuit pattern 202 is formed at the location of the metal circuit pattern 201 on the substrate 200. As shown in FIG. 5D, after the metal circuit pattern 201 completely reacts with the graphene oxide, the metal circuit pattern 201 is completely consumed, so the graphene circuit pattern 202 takes the place of the metal circuit pattern 201 at the original location of the metal circuit pattern 201. In this embodiment, the substrate 200, for example, may be a substrate which is employed in an electronic product, such as a liquid crystal display panel or an organic light-emitting display panel. Therefore, after the graphene circuit pattern 202 is formed on the substrate 200 by the method of the embodiments, the graphene circuit pattern 202 may serve as signal lines of the electronic product, and then subsequent preparation processes can be performed.

The method of preparing a graphene circuit pattern provided by the embodiments is simple in preparation process, low in cost, and suitable for mass production; and the graphene circuit pattern, which is prepared by the method of preparing a graphene circuit pattern provided by the embodiments, may be directly formed on the substrate, and may be patterned by use of the patterned metal circuit pattern; in addition, the graphene circuit pattern is adjustable in size, and due to excellent electrical conductivity and stability thereof, the graphene circuit pattern can have high electrical conductivity in term of the thin thickness thereof; the graphene circuit pattern, which is prepared by the method of preparing a graphene circuit pattern provided by the embodiments, may be applied as signal lines or the like in various applications, such as an electronic product.

The embodiments of the present disclosure provide a graphene circuit pattern (referring to the pattern 102 in FIG. 2C and the pattern 202 in FIG. 5C), which is prepared by any one of the aforementioned methods. The formation state of the graphene circuit pattern may be adjusted according to requirements by selecting a pattern and a size of a primary metal circuit pattern in a preparation process. The graphene circuit pattern has excellent electrical conductivity and stability, and can take the place of a metal (such as copper, aluminum, etc.) circuit pattern and be applied as signal lines or the like in various applications, such as an electronic product.

Figure 7:
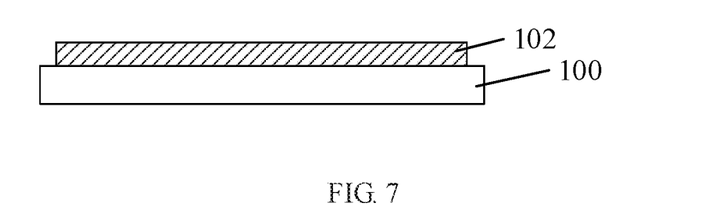
FIG. 7 is a schematic diagram of a substrate provided by an embodiment of the present disclosure.

The embodiments of the present disclosure further provide a substrate. As shown in FIG. 7, the substrate 100 comprises the graphene circuit pattern 102; or, as shown in FIG. 5D, the substrate 200 comprises the graphene circuit pattern 202. The substrate is, for example, a circuit board which employs the graphene circuit pattern as signal lines.

Figure 8:
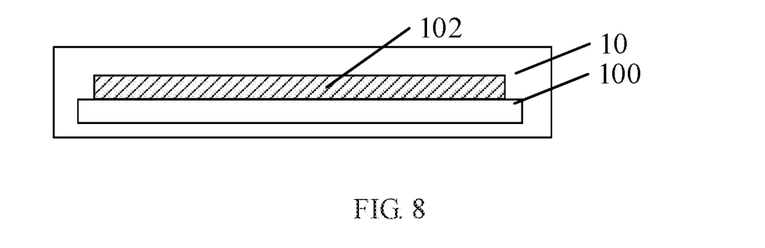
FIG. 8 is a schematic diagram of an electronic product provided by an embodiment of the present disclosure.

The embodiments of the present disclosure provide an electronic product, and as shown in FIG. 8, the electronic product 10 comprises the substrate 100. In the electronic product, the graphene circuit pattern 102 may serve as signal lines. The electronic product may be, for example, an electronic product such as a liquid crystal display panel, an organic light-emitting display panel, etc.

For example, when the electronic product is a liquid crystal display panel, because the graphene circuit pattern has an excellent electrical conductivity, the graphene circuit pattern may be formed with a thickness smaller than that of a metal (such as copper, etc.) signal line which is generally employed in a display panel, for example, the graphene circuit pattern may be formed with a thickness of 40-300 nm, for example a thickness of 100 nm; therefore, when other functional layers are formed on the graphene circuit pattern, the thickness difference between layers can be reduced, so that orientation disorder areas of liquid crystal, which results from the disordered orientation of liquid crystal molecules on both sides of margins of the graphene circuit pattern due to the thickness difference of each layer, can be reduced; therefore, the design width of a black matrix in the liquid crystal display panel can be further reduced, thus the aperture ratio of pixels of the liquid crystal display panel can be increased. In addition, in the electronic product, the graphene circuit pattern with a smaller thickness is applied, instead of a conventional metal circuit pattern which is more helpful to a thinness design of the electronic product; at the same time, the graphene pattern applied in the electronic product has an excellent stability, which can avoid phenomena, such as corrosion, etc., that may occur in the conventional metal circuit pattern, thus being more favorable to improve a life of the electronic product.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale. However, it should be understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A method of preparing a graphene circuit pattern, comprising: immersing a metal circuit pattern in a graphene oxide solution to cause a redox reaction between the metal circuit pattern and graphene oxide so that the metal circuit pattern is completely consumed, thereby forming the graphene circuit pattern at a location of the metal circuit pattern.

2. The method of preparing a graphene circuit pattern according to claim 1, wherein the metal circuit pattern comprises a circuit pattern formed of a copper containing metallic material, an aluminum containing metallic material or an iron containing metallic material.

3. The method of preparing a graphene circuit pattern according to claim 1, wherein the graphene oxide solution is a dispersion of the graphene oxide in water.

4. The method of preparing a graphene circuit pattern according to claim 1, wherein a concentration of the graphene oxide solution is (0.01-10) g/L.

5. The method of preparing a graphene circuit pattern according to claim 4, wherein the concentration of the graphene oxide solution is (0.1-1) g/L.

6. The method of preparing a graphene circuit pattern according to claim 1, wherein a thickness of the metal circuit pattern is 20 nm-1000 nm.

7. The method of preparing a graphene circuit pattern according to claim 6, wherein the thickness of the metal circuit pattern is 40 nm-700 nm.

8. The method of preparing a graphene circuit pattern according to claim 1, further comprising:
drying the graphene circuit pattern.

9. The method of preparing a graphene circuit pattern according to claim 8, wherein the drying is performed at a temperature of 1° C.-10° C.

10. The method of preparing a graphene circuit pattern according to claim 9, wherein the drying is performed at a temperature of 4° C.-7° C.

11. The method of preparing a graphene circuit pattern according to claim 1, further comprising:
preparing the metal circuit pattern on a substrate, and then immersing the substrate with the metal circuit pattern in the graphene oxide solution.

12. The method of preparing a graphene circuit pattern according to claim 1, wherein a concentration of the graphene oxide solution and/or a time period of the redox reaction is adjusted to control a thickness of the graphene circuit pattern.

13. The method of preparing a graphene circuit pattern according to claim 2, wherein the graphene oxide solution is a dispersion of the graphene oxide in water.

14. The method of preparing a graphene circuit pattern according to claim 2, wherein a concentration of the graphene oxide solution is (0.01-10) g/L.

15. The method of preparing a graphene circuit pattern according to claim 2, further comprising:
   drying the graphene circuit pattern.

16. The method of preparing a graphene circuit pattern according to claim 2, further comprising:
   preparing the metal circuit pattern on a substrate, and then immersing the substrate with the metal circuit pattern in the graphene oxide solution.

17. The method of preparing a graphene circuit pattern according to claim 2, wherein a concentration of the graphene oxide solution and/or a time period of the redox reaction is adjusted to control a thickness of the graphene circuit pattern.

\* \* \* \* \*